United States Patent
Yamamoto

(10) Patent No.: US 9,601,689 B2
(45) Date of Patent: Mar. 21, 2017

(54) MEMORY DEVICE

(71) Applicant: Kabushiki Kaisha Toshiba, Minato-ku (JP)

(72) Inventor: Kazuhiko Yamamoto, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 6 days.

(21) Appl. No.: 14/601,365

(22) Filed: Jan. 21, 2015

(65) Prior Publication Data
US 2016/0079522 A1  Mar. 17, 2016

Related U.S. Application Data

(60) Provisional application No. 62/048,843, filed on Sep. 11, 2014.

(51) Int. Cl.
*H01L 45/00* (2006.01)

(52) U.S. Cl.
CPC .......... *H01L 45/06* (2013.01); *H01L 45/1253* (2013.01); *H01L 45/144* (2013.01)

(58) Field of Classification Search
CPC ......... H01L 27/11502; H01L 27/11507; H01L 43/08; H01L 45/06; H01L 21/768; H01L 2924/1435; H01L 27/24; H01L 45/04; H01L 45/1286; H01L 45/1253; H01L 45/144; H01C 7/1013; G11C 13/0004; G11C 14/0045; G11C 11/00
See application file for complete search history.

(56) References Cited

U.S. PATENT DOCUMENTS

| 3,856,567 | A | * | 12/1974 | Pitha | H01C 7/118 252/516 |
| 6,051,858 | A | * | 4/2000 | Uchida | H01L 28/55 257/295 |
| 6,930,909 | B2 | * | 8/2005 | Moore | G11C 13/0004 365/148 |
| 8,649,213 | B2 | | 2/2014 | Goux | |
| 2003/0234449 | A1 | * | 12/2003 | Aratani | H01L 27/105 257/758 |
| 2004/0037179 | A1 | * | 2/2004 | Lee | G11C 13/0004 369/47.1 |
| 2007/0012956 | A1 | * | 1/2007 | Gutsche | B82Y 10/00 257/246 |

(Continued)

FOREIGN PATENT DOCUMENTS

WO  WO 2012/117773 A1  9/2012

OTHER PUBLICATIONS

Takasumi Ohyanagi, et al., "Special Electrical Characteristics of Superlattice Phase Change Memory", ECS Transactions, vol. 58, No. 5, 2013, pp. 135-138.

(Continued)

*Primary Examiner* — Allen Parker
*Assistant Examiner* — Gustavo Ramallo
(74) *Attorney, Agent, or Firm* — Oblon, McClelland, Maier & Neustadt, L.L.P.

(57) ABSTRACT

According to one embodiment, a memory device includes a plug, a variable resistance film provided on the plug, and an electrode provided on the variable resistance film. The variable resistance film includes, a first portion having a superlattice structure, and a second portion having an amorphous structure.

20 Claims, 16 Drawing Sheets

(56) References Cited

U.S. PATENT DOCUMENTS

| | | | |
|---|---|---|---|
| 2008/0096341 A1* | 4/2008 | Lai | G11C 11/5678 438/210 |
| 2008/0164504 A1* | 7/2008 | Chen | H01L 27/2409 257/296 |
| 2008/0191187 A1* | 8/2008 | Lung | G11C 13/0004 257/4 |
| 2008/0268565 A1* | 10/2008 | Lung | H01L 45/06 438/96 |
| 2009/0180314 A1* | 7/2009 | Liu | G11C 11/5678 365/163 |
| 2010/0155784 A1* | 6/2010 | Scheuerlein | G11C 13/0004 257/209 |
| 2011/0315942 A1 | 12/2011 | Tominaga | |
| 2012/0217476 A1* | 8/2012 | Ikeno | G11C 11/161 257/16 |
| 2013/0221310 A1 | 8/2013 | Morikawa | |
| 2014/0063924 A1* | 3/2014 | Nakai | G11C 11/16 365/158 |
| 2014/0252304 A1* | 9/2014 | Soeya | H01L 45/144 257/5 |

OTHER PUBLICATIONS

Toru Egami, et al., "Investigation of multi-level-cell and SET operations on super-lattice phase change memories", Japanese Journal of Applied Physics, vol. 53, No. 04ED02, 2014, pp. 1-8.

R. E. Simpson, et al., "Interfacial phase-change memory", Nature Nanotechnology, DOI: 10.1038, 2011, pp. 1-5.

* cited by examiner

MEMORY DEVICE

CROSS-REFERENCE TO RELATED APPLICATIONS

This application is based upon and claims the benefit of priority from U.S. Provisional Patent Application 62/048,843, filed on Sep. 11, 2014; the entire contents of which are incorporated herein by reference.

FIELD

Embodiments described herein relate generally to a memory device.

BACKGROUND

Conventionally in a phase change memory element (PCRAM), the phase state of a phase change material used as a memory element has been controlled by the temperature change of a resistor contacting the phase change material. Because the temperature of the resistor is adjusted by Joule heat generated by causing a current to flow in the resistor, it has been necessary to conduct a large current through the resistor to change the phase states by melting and crystallizing. Therefore, problems existed such as the consumed amount of the electrical power necessary for operation being large, the memory element structure being subjected to mechanical damage caused by the volume contraction of the phase change material due to the phase change, etc. On the other hand, materials that form a superlattice structure in which a resistance change characteristic can arise due to a slight difference of the atomic arrangement are drawing attention as the phase change material of the phase change memory element.

DETAILED DESCRIPTION

In general, according to one embodiment, a memory device includes a plug, a variable resistance film provided on the plug, and an electrode provided on the variable resistance film. The variable resistance film includes, a first portion having a superlattice structure, and a second portion having an amorphous structure.

Embodiments of the invention will now be described with reference to the drawings.

First Embodiment

First, a first embodiment will be described.

Figure 1:
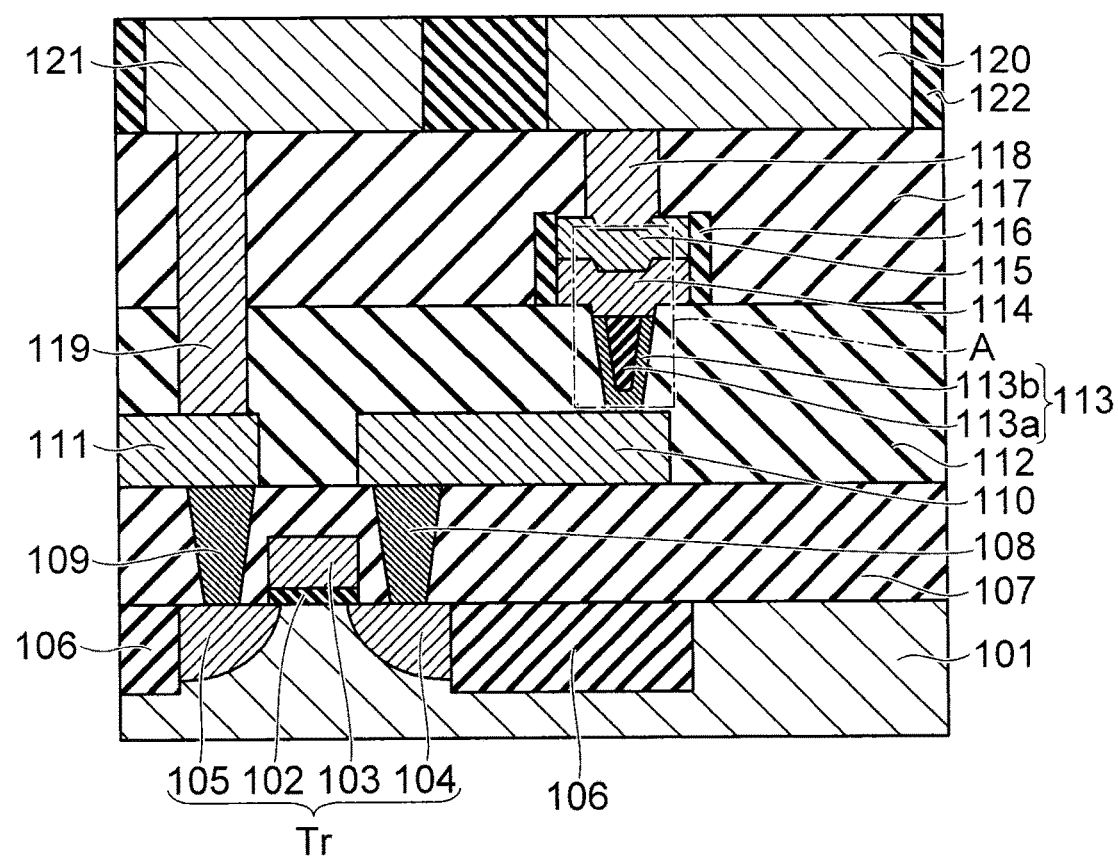
FIG. 1 is a cross-sectional view showing a memory device according to a first embodiment.

FIG. 1 is a cross-sectional view showing a memory device according to the embodiment.

Figure 2:
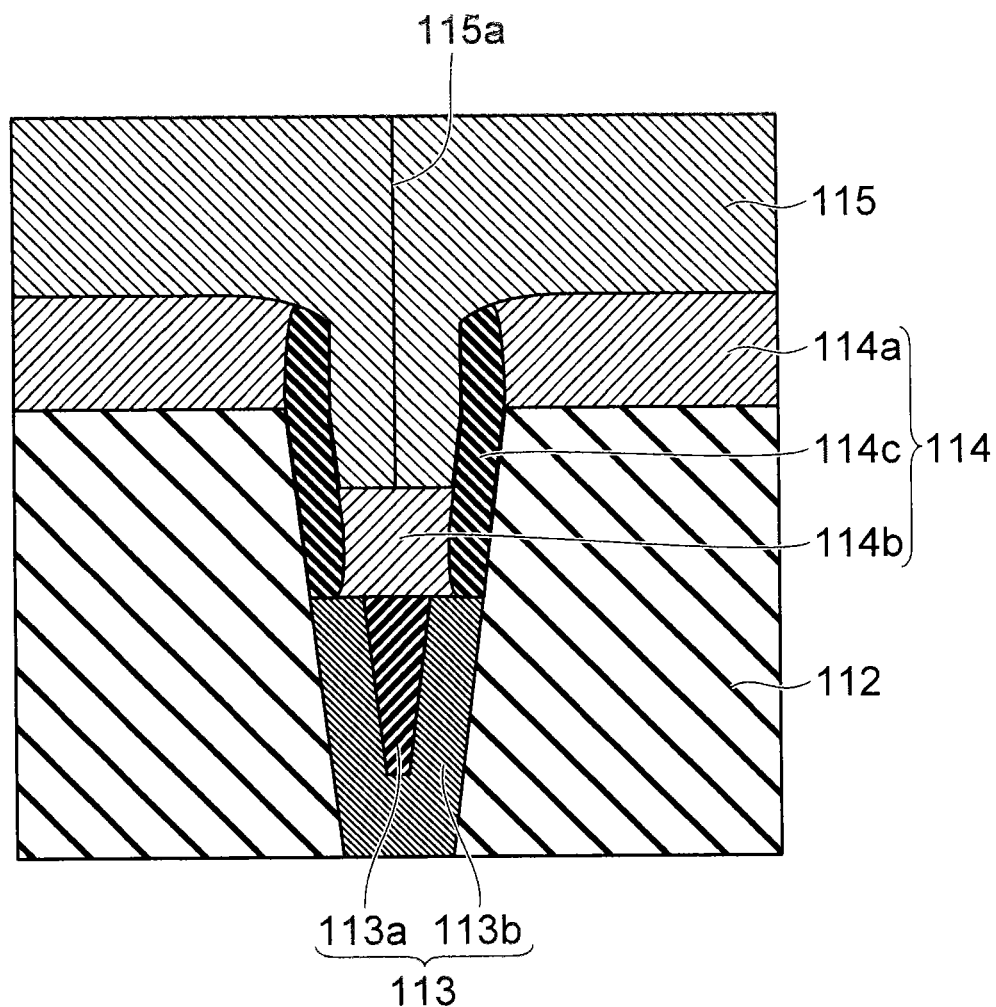
FIG. 2 is an enlarged cross-sectional view of portion A shown in FIG. 1 of the memory device according to the first embodiment.

FIG. 2 is an enlarged cross-sectional view of portion A shown in FIG. 1 of the memory device according to the first embodiment.

As shown in FIG. 1, a semiconductor substrate 101 is provided in the memory device 100 according to the embodiment.

A gate insulator film 102 is provided in one portion on the semiconductor substrate 101. A control gate electrode 103 is provided on the gate insulator film 102. The control gate electrode 103 is electrically connected to an external electrode pad (not shown); and a voltage is supplied to the control gate electrode 103 by applying a voltage to the external electrode. Source/drain regions 104 and 105 are formed in the upper layer portion of the semiconductor substrate 101 on two sides of the region directly under the gate insulator film 102. The portion of the semiconductor substrate 101 between the source/drain region 104 and the source/drain region 105 is used as a channel region. The channel region, the gate insulator film 102, the control gate electrode 103, and the source/drain regions 104 and 105 are included in a transistor Tr.

Also, in FIG. 1, an element isolation film 106 is provided around the transistor Tr in the upper layer portion of the semiconductor substrate 101. The element isolation film 106 is provided to contact the source/drain region 104 or the source/drain region 105. Also, an inter-layer insulating film 107 is provided on the semiconductor substrate 101 to cover the gate insulator film 102 and the control gate electrode 103.

A contact plug 108 is provided on the source/drain region 104; and a contact plug 109 is provided on the source/drain region 105. The contact plugs 108 and 109 are provided so that each pierces the inter-layer insulating film 107.

The contact plugs 108 and 109 are formed of, for example, a metal material such as titanium (Ti), titanium nitride (TiN), tungsten (W), etc.

Interconnects 110 and 111 are provided on the inter-layer insulating film 107.

The interconnects 110 and 111 are formed of, for example, a metal material such as tungsten (W), etc. The interconnect 110 is connected to the source/drain region 104 by the contact plug 108. Also, the interconnect 111 is connected to the source/drain region 105 by the contact plug 109. That is, the interconnect 110 is provided above the source/drain region 104 and the element isolation film 106 provided to contact the source/drain region 104. The interconnect 111 is provided above the source/drain region 105 and the element isolation film 106 provided to contact the source/drain region 105.

An insulating film 112 is provided on the inter-layer insulating film 107 to cover the interconnects 110 and 111.

A plug 113 is provided on the interconnect 110 to pierce the upper layer portion of the insulating film 112. The upper surface of the plug 113 is provided to be lower than the upper surface of the insulating film 112. Thereby, a difference in levels is formed between the upper surface of the plug 113 and the upper surface of the insulating film 112.

The plug 113 is formed so that the side surface and bottom surface of an insulating member 113a are covered with a metal film 113b. The configuration of the plug 113 is, for example, a truncated circular cone; and the upper surface of the insulating member 113a is exposed at the central portion of the upper surface of the plug 113. Also, the surfaces other than the upper surface of the insulating member 113a with the insulating member 113a as the center are covered with the metal film 113b. The insulating member 113a is formed of, for example, an insulating material such as silicon oxide, a silicon nitride film, etc.; and the metal film 113b is formed of, for example, a metal material such as titanium nitride, tungsten, etc.

Although the plug 113 is formed of the insulating member 113a and the metal film 113b, the plug 113 may include only the metal film 113b. Also, the plug represents a member extending in the vertical direction and for connecting interconnects each other or connecting the interconnect and semiconductor substrate in the specification.

As shown in FIG. 2, a variable resistance film 114 is provided in a region that is on the insulating film 112 and includes the region directly above the plug 113. The variable resistance film 114 that is on the upper surface of the insulating film 112 forms a superlattice structure region 114a. Also, the variable resistance film 114 that is provided on the upper surface of the plug 113 forms a superlattice structure region 114b. On the other hand, the variable resistance film 114 that is provided at the side surface of the difference in levels between the upper surface of the plug 113 and the upper surface of the insulating film 112 and in the region directly above the side surface forms an amorphous structure region 114c including a polycrystal. The superlattice structure region 114a and the superlattice structure region 114b are separated by the amorphous structure region 114c. Amorphous structure region represents a region having the amorphous structure in the specification. Also, amorphous structure represents structure having no regular three-dimensional structure. The amorphous structure region may contain microcrystals. Accordingly, the superlattice structure region 114b is formed in the region directly above the central portion of the plug 113; and the amorphous structure region 114c that includes the polycrystal is formed in the region directly above the outer circumferential portion of the plug 113.

A conductive member 115 is provided on the variable resistance film 114.

At this time, in the case where the difference in levels between the upper surface of the plug 113 and the upper surface of the insulating film 112 is somewhat large, a boundary 115a which is a discontinuity of a crystal structure is formed in the conductive member 115 in the region directly above the superlattice structure region 114b. In the case where the difference in levels is small, the boundary 115a is not formed.

Continuing as shown in FIG. 1, an insulating member 116 is provided to cover the side surfaces of the variable resistance film 114 and the conductive member 115. An insulating film 117 is provided to cover the variable resistance film 114, the conductive member 115, and the insulating member 116. A pillar 118 is provided to pierce the upper layer portion of the insulating film 117. The bottom surface of the pillar 118 contacts the upper surface of the conductive member 115.

Also, a pillar 119 is provided to pierce the insulating film 117 and the upper layer portion of the insulating film 112. The pillar 119 contacts the upper surface of the interconnect 111.

Interconnects 120 and 121 are provided on the insulating film 117. The interconnect 120 contacts the pillar 118; and the interconnect 121 contacts the pillar 119. An insulating film 122 is provided on the upper surface of the insulating film 117 in the region where the interconnect 120 or the interconnect 121 is not provided.

A method for manufacturing the memory device 100 will now be described.

FIG. 3A to FIG. 7B are cross-sectional views of processes, showing the method for manufacturing the memory device 100 according to the first embodiment.

Figure 4A:
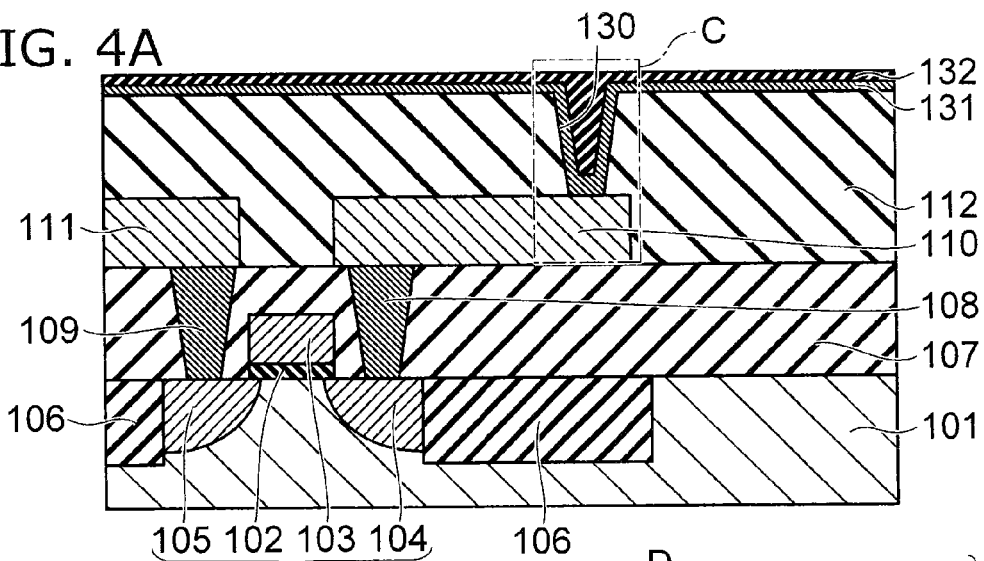
Figure 8:
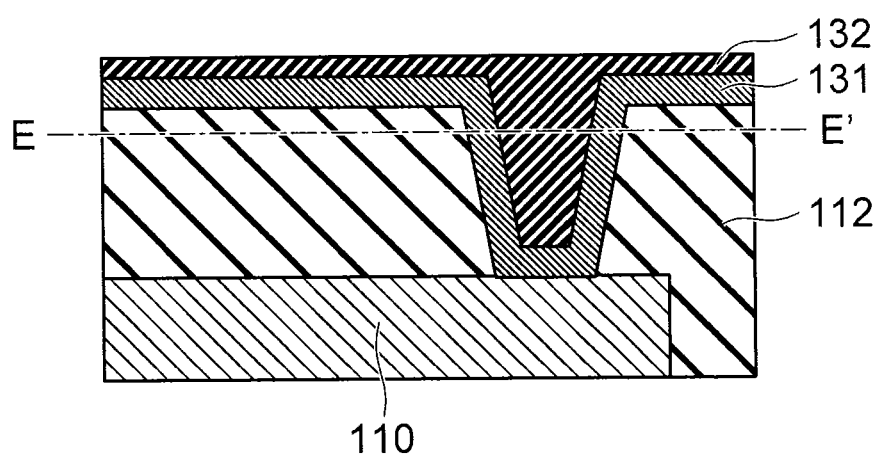
FIG. 8 is an enlarged cross-sectional view showing planarization of portion C shown in FIG. 4A by CMP (Chemical Mechanical Polishing)

FIG. 8 is an enlarged cross-sectional view showing planarization of portion C shown in FIG. 4A by CMP (Chemical Mechanical Polishing).

Figure 3A:
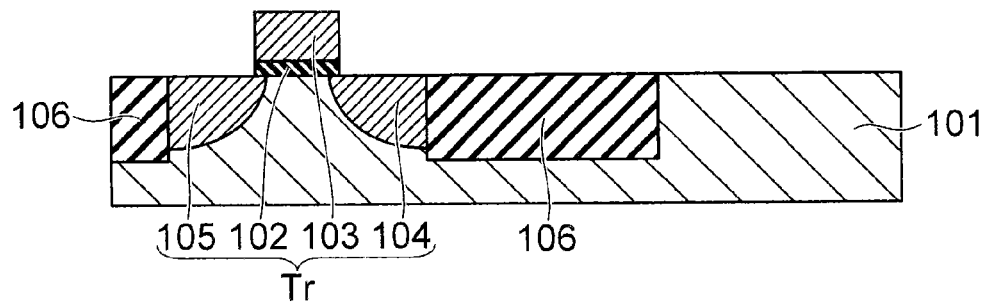
FIG. 3A to FIG. 7B are cross-sectional views of processes, showing a method for manufacturing the memory device according to the first embodiment.

First, as shown in FIG. 3A, the element isolation film 106 is selectively formed in the upper layer portion of the semiconductor substrate 101.

Then, the gate insulator film 102 is formed in a region directly above a portion of the semiconductor substrate 101 where the element isolation film 106 is not provided. Subsequently, the control gate electrode 103 is formed on the gate insulator film 102. Then, the source/drain regions 104 and 105 are formed on the semiconductor substrate 101 by implanting ions using the control gate electrode 103 as a mask. The portion between the source/drain region 104 and the source/drain region 105 is used as a channel region. Thereby, the transistor Tr is formed from the channel region, the gate insulator film 102, the control gate electrode 103, and the source/drain regions 104 and 105.

Figure 3B:
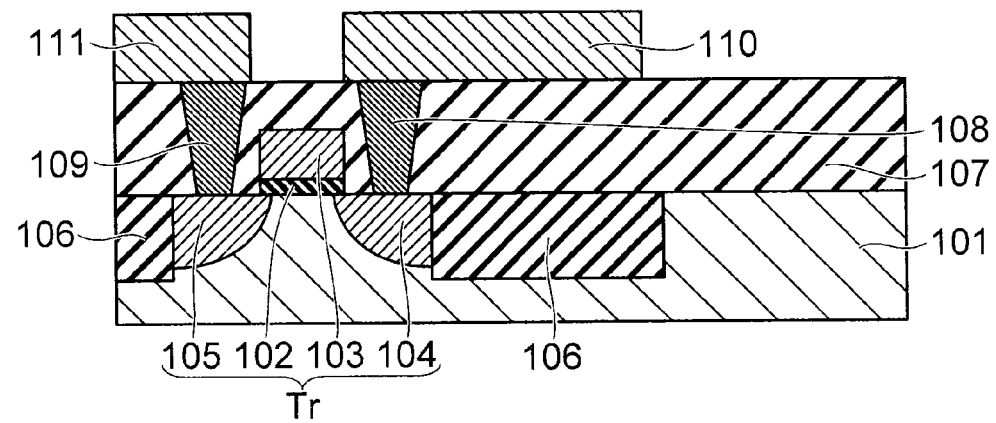

Then, as shown in FIG. 3B, the inter-layer insulating film 107 is formed on the semiconductor substrate 101 to cover the gate insulator film 102 and the control gate electrode 103.

Then, through-holes are made in the inter-layer insulating film 107 to respectively reach the source/drain regions 104 and 105. Then, a metal material such as titanium, titanium nitride, tungsten, etc., is deposited on the inter-layer insulating film 107. At this time, the through-hole interiors are filled with the metal material. Then, by CMP, the metal material and the insulating material that are on the inter-layer insulating film 107 are removed; and the metal material and the insulating material that are inside the through-holes remain. Thereby, the contact plugs 108 and 109 are formed. The contact plug 108 is formed by covering the side surface and bottom surface of an insulating member 108a with a metal film 108b; and the contact plug 109 is formed by covering the side surface and bottom surface of an insulating member 109a with a metal film 109b.

When making the through-holes in the inter-layer insulating film 107 to respectively reach the source/drain regions 104 and 105, a through-hole that reaches the control gate electrode 103 is made simultaneously or by subdividing the process. As a result, a contact plug (not shown) can be made also to the control gate electrode 103 simultaneously with the process of forming the contact plug 109 recited above.

Then, the interconnects 110 and 111 are formed on the inter-layer insulating film 107. A portion of the interconnect 110 is formed on the contact plug 108 upper surface. Also, a portion of the interconnect 111 is formed on the upper surface of the contact plug 109.

Figure 3C:
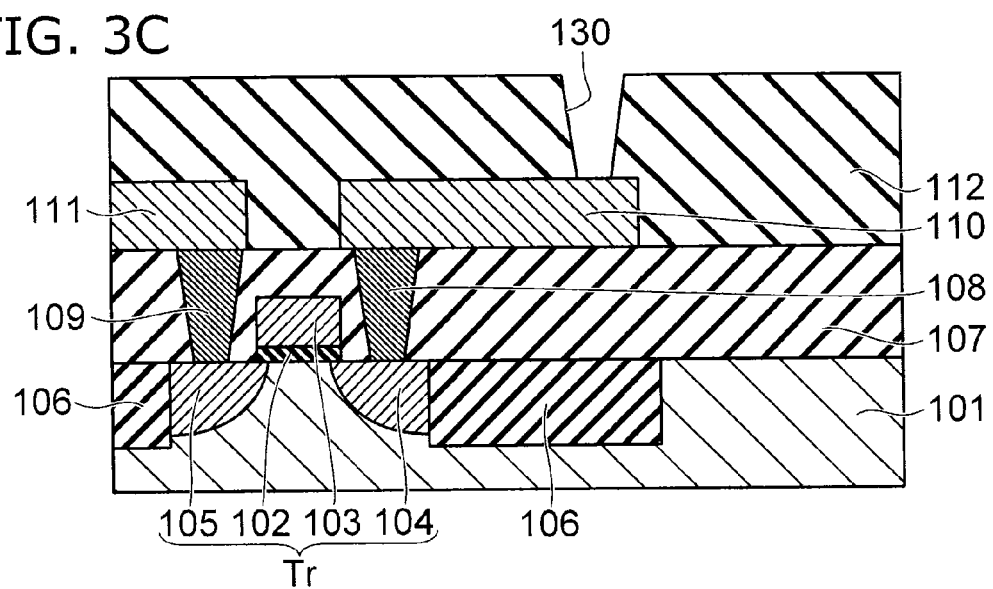

Then, as shown in FIG. 3C, the insulating film 112 is formed on the inter-layer insulating film 107 to cover the interconnects 110 and 111. Subsequently, a through-hole 130 is made onto the interconnect 110 by anisotropic etching such as RIE (Reactive Ion Etching), etc., to pierce the upper layer portion of the inter-layer insulating film 112. The through-hole 130 reaches the upper surface of the interconnect 110.

Then, as shown in FIG. 4A, a conductive film 131 is formed of, for example, a metal material such as titanium nitride, etc., on the insulating film 112. The conductive film 131 is formed to cover the bottom surface and side surface of the through-hole 130. Subsequently, an insulating film 132 using silicon oxide is formed on the conductive film 131. The insulating film 132 may be a silicon nitride film. At this time, the film thickness of the conductive film 131 is formed to be thinner than the radius of the through-hole 130. Then, the insulating film 132 is formed to fill the through-hole 130.

Figure 4B:
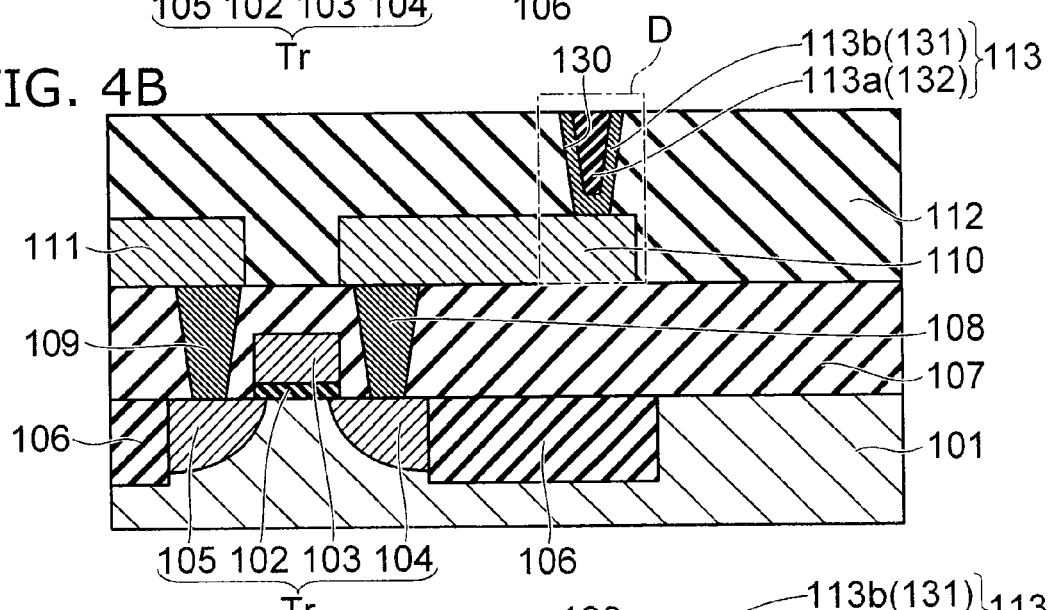

Then, as shown in FIG. 4B, the conductive film 131 and the insulating film 132 that are on the insulating film 112 are removed by planarization such as CMP, etc. At this time, the planarization is performed so that the conductive film 131 and the insulating film 132 remain inside the through-hole 130. Thereby, the plug 113 is formed by one portion of the conductive film 131 remaining in the through-hole 130 interior as the metal film 113*b* and one portion of the insulating film 132 remaining in the through-hole 130 interior as the insulating member 113*a*. Also, in the planarization as shown in FIG. 8, the conductive film 131 is formed in the through-hole 130 interior to have a film thickness that is thinner than the radius of the through-hole 130. Then, the through-hole 130 is filled with the insulating film 132. The CMP described above is performed so that a portion of the insulating film 132 remains inside the through-hole. For example, the CMP processing is performed so that the portion under the position of line E-E' shown in FIG. 8 remains.

The configuration of the plug 113 is, for example, a truncated circular cone.

Figure 4C:
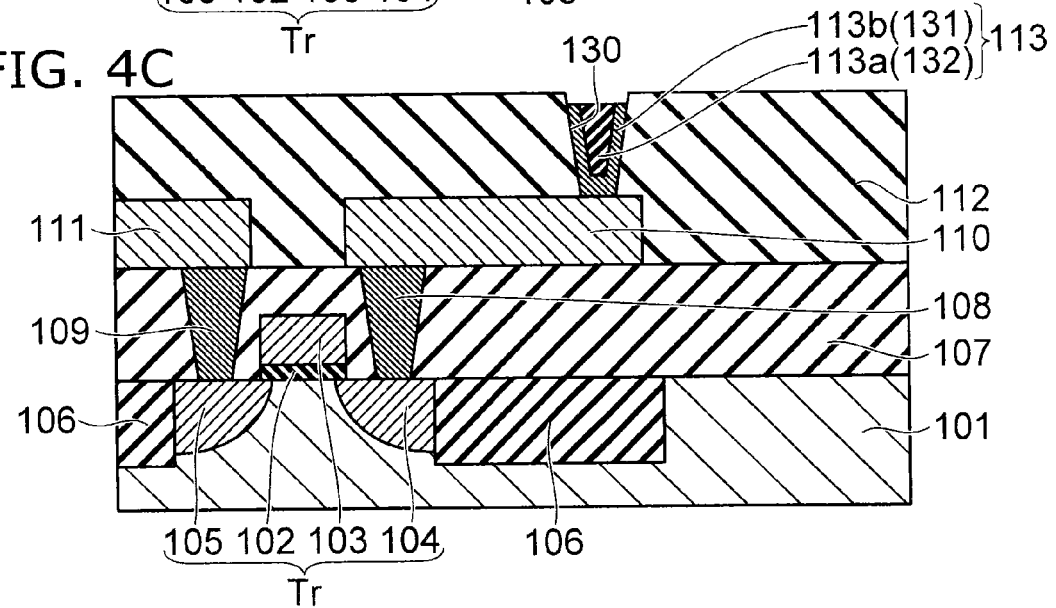

Then, as shown in FIG. 4C, the upper portion of the plug 113 formed from the insulating member 113*a* and the metal film 113*b* is caused to recede by wet etching using, for example, sulfuric acid, an aqueous hydrogen peroxide mixed liquid, etc. At this time, it is desirable for the receded amount of the plug 113 to be 5 nm or more as viewed from the upper surface of the insulating film 112. Also, the surface of the plug 113 may be caused to recede by wet etching after plasma oxidation inside an argon (Ar) and oxygen atmosphere. Further, the plug 113 may be caused to recede by dry etching using chlorine gas. Further, after the plug 113 is caused to recede, the diameter of the opening of the insulating film 112 on the plug 113 may be made narrow by forming an insulating film on the insulating film 112 and on the plug 113, performing etch-back of the entire surface, and causing the insulating film to remain on the stepped portion between the insulating film 112 and the plug 113.

Figure 5A:
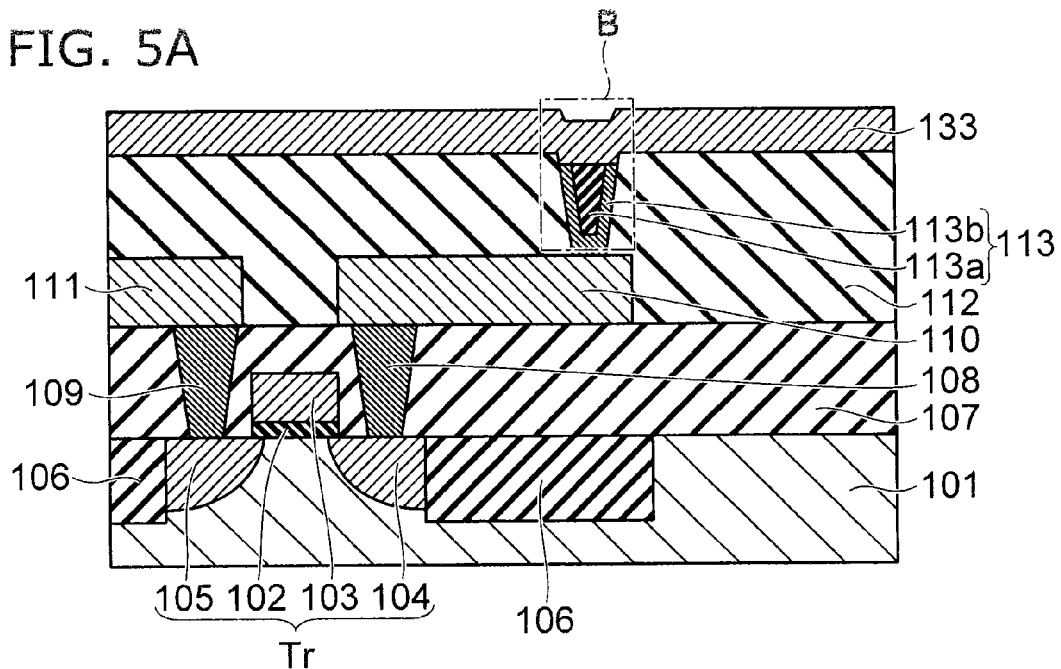

Then, as shown in FIG. 5A, a variable resistance film 133 is formed on the upper surface of the insulating film 112 and on the upper surface of the plug 113. The variable resistance film 133 is formed by repeatedly stacking thin layers including germanium telluride (GeTe) and antimony telluride (SbTe) using sputtering. Although sputtering is described as an example, CVD (vapor deposition), molecular beam epitaxy, vapor deposition, etc., may be used.

Figure 5B:
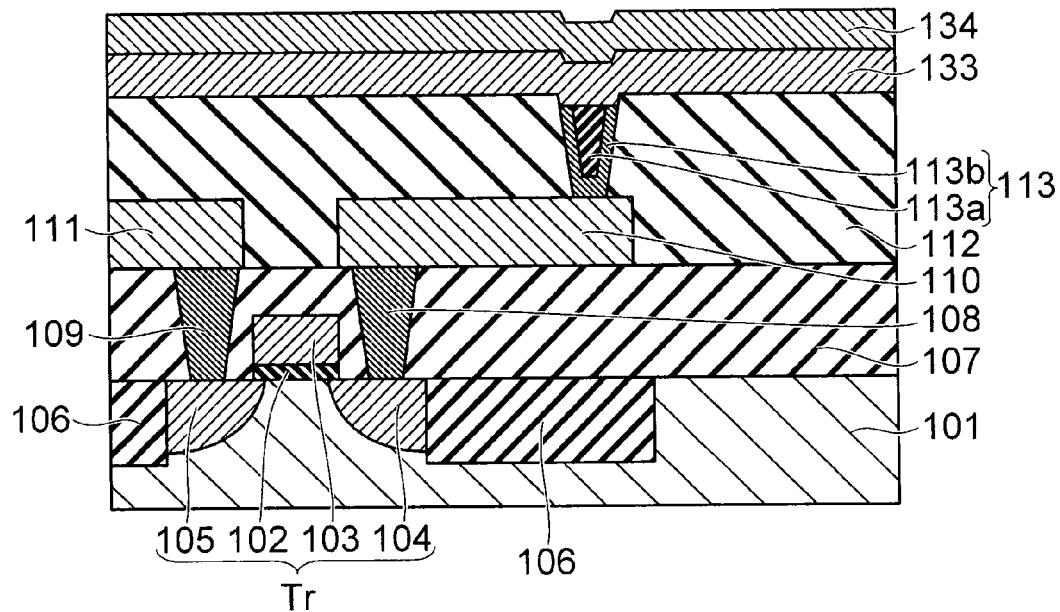

Then, as shown in FIG. 5B, a conductive film 134 is formed on the variable resistance film 133. The conductive film 134 is formed using, for example, a conductive material such as tungsten, titanium, tantalum, a nitride of these elements, etc.

Figure 6A:
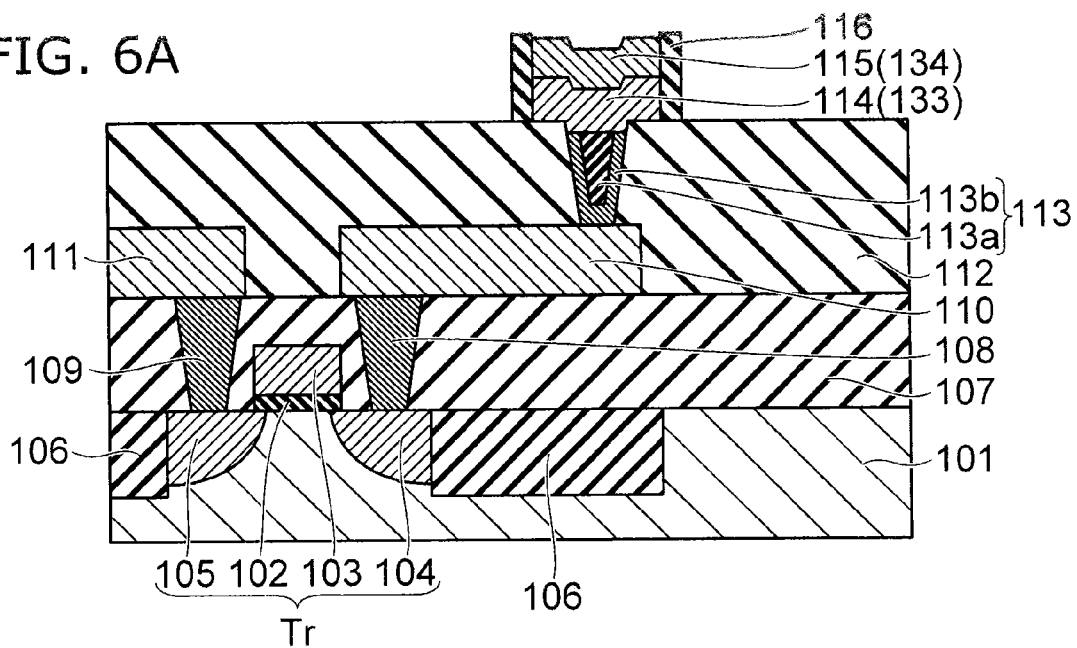

Then, as shown in FIG. 6A, the variable resistance film 133 and the conductive film 134 are removed by anisotropic etching such as RIE, etc., so that the variable resistance film 133 and the conductive film 134 remain only in a region on the insulating film 112 including the region directly above the plug 113. Thereby, the variable resistance film 133 is patterned into the variable resistance film 114; and the conductive film 134 is patterned into the conductive member 115.

Then, an insulating film is formed on the insulating film 112 to cover the variable resistance film 114 and the conductive member 115. Subsequently, etch-back of the entire surface is performed. Thereby, a portion of the insulating film formed on the insulating film 112 remains as the insulating member 116 on the side surfaces of the variable resistance film 114 and the conductive member 115.

Figure 6B:
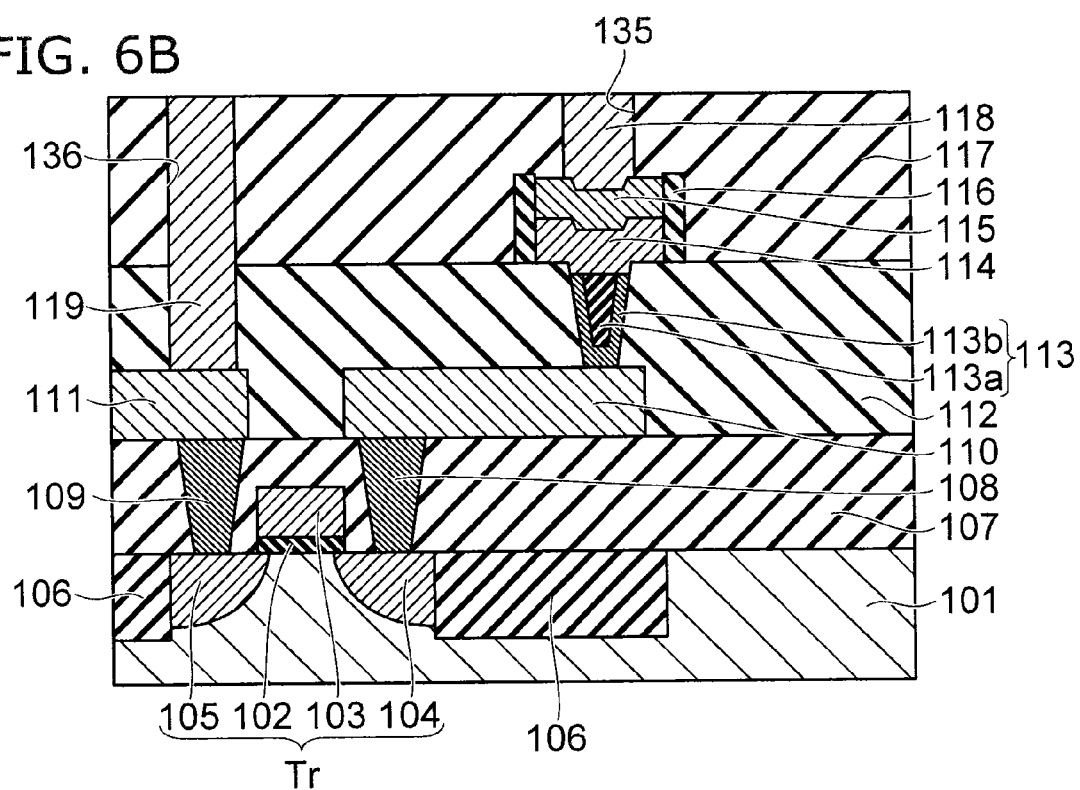

Then, as shown in FIG. 6B, the insulating film 117 is formed on the insulating film 112 to cover the variable resistance film 114, the conductive member 115, and the insulating member 116. Subsequently, a through-trench 135 is made in the region directly above the conductive member 115 to pierce the upper layer portion of the insulating film 117. The through-trench 135 is caused to reach the upper surface of the conductive member 115. Also, a through-hole 136 is made in the region directly above the interconnect 111 to pierce the insulating film 117 and the upper layer portion of the insulating film 112. The through-hole 136 is caused to reach the upper surface of the interconnect 111.

Then, a metal material such as tungsten, etc., is deposited on the insulating film 117. Thereby, the metal material such as tungsten, etc., is filled into the interiors of the through-trenches 135 and 136. Then, by performing CMP, the metal material that is on the upper surface of the insulating film 117 is removed; and the metal material that is inside the through-trenches 135 and 136 is caused to remain. Thereby, a pillar 118 is formed in the interior of the through-trench 135; and the pillar 119 is formed in the interior of the through-hole 136.

Figure 7A:
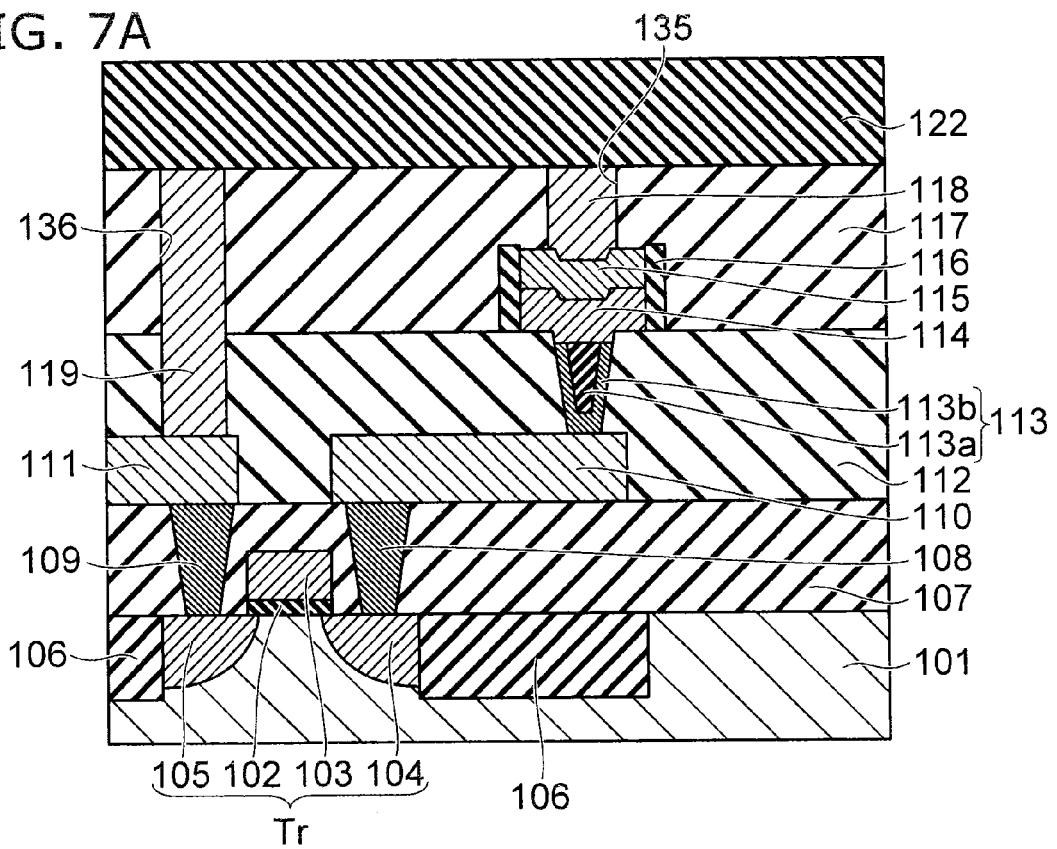

Then, as shown in FIG. 7A, the insulating film 122 is formed on the insulating film 117.

Figure 7B:
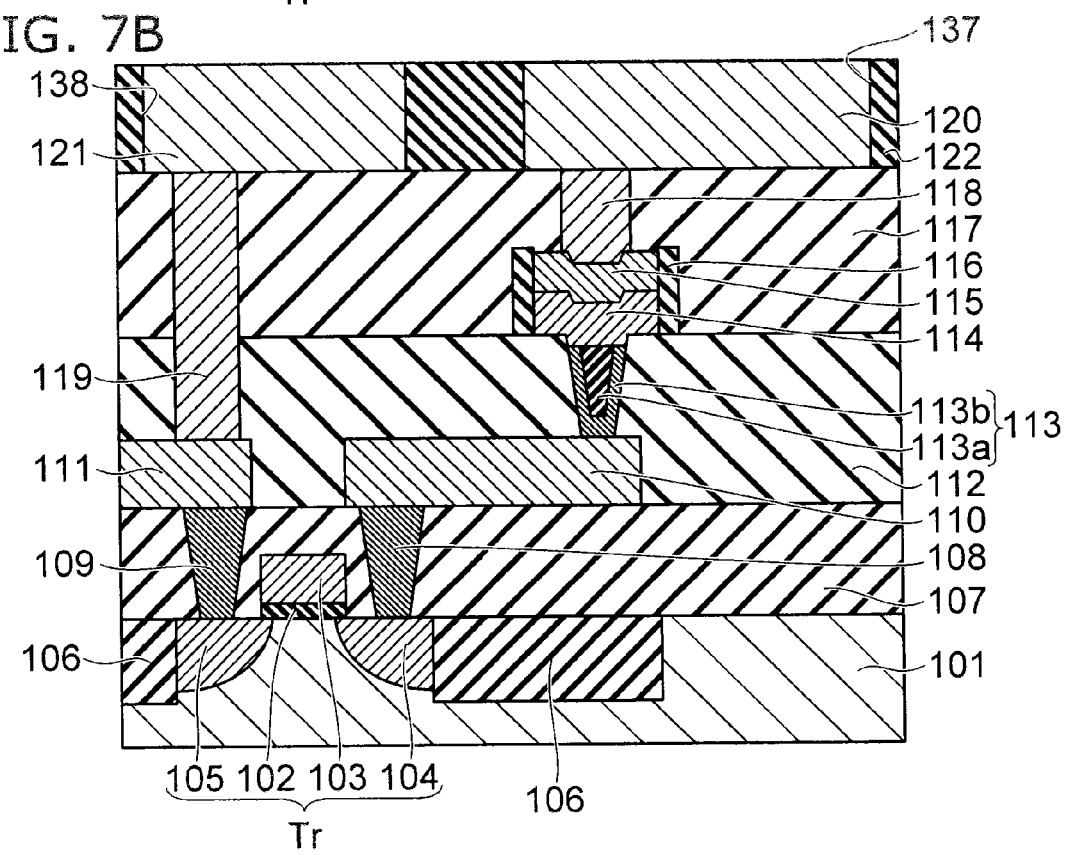

Then, as shown in FIG. 7B, an opening 137 is made in a region including the region directly above the pillar 118 of the insulating film 122 by anisotropic etching such as RIE, etc. At this time, also, an opening 138 is made in a region including the region directly above the pillar 119 of the insulating film 122. The opening 137 and the opening 138 are separated. Subsequently, a conductive film is formed on the insulating film 122 to fill the openings 137 and 138. Then, the conductive film that is on the insulating film 122 is removed by performing planarization such as CMP, etc. Thereby, the conductive film that remains in the opening 137 is patterned as the interconnect 120; and the conductive film that remains in the opening 138 is patterned as the interconnect 121.

Thereafter, the various interconnect layers and/or circuit elements are formed using general methods for manufacturing. Thus, the memory device of the embodiment is manufactured.

Thus, the memory device according to the embodiment is formed. Effects of the embodiment will now be described.

Figure 9A:
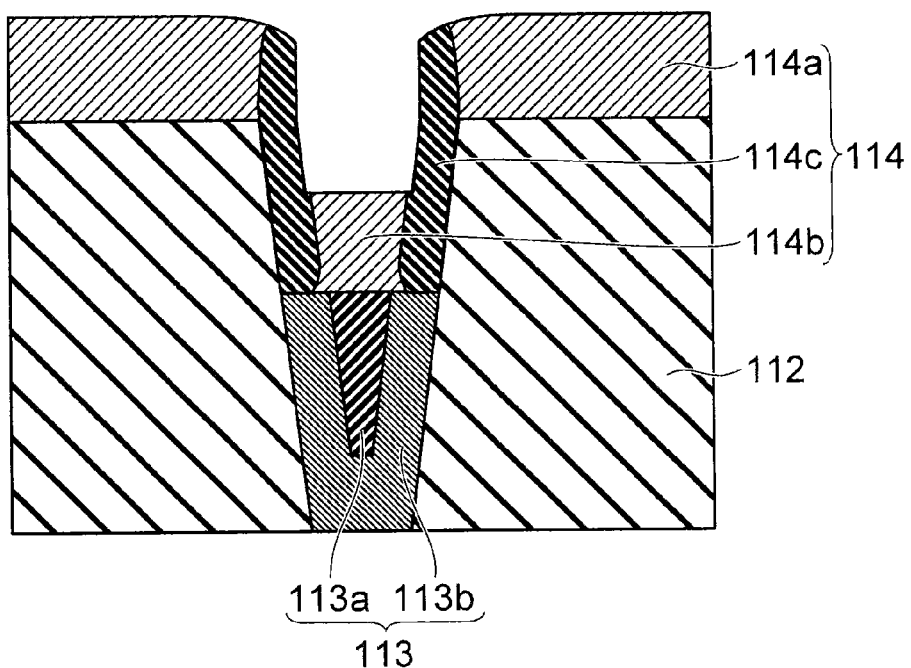
FIG. 9A is an enlarged view of portion B shown in FIG. 5A of the memory device according to the first embodiment.
Figure 9B:
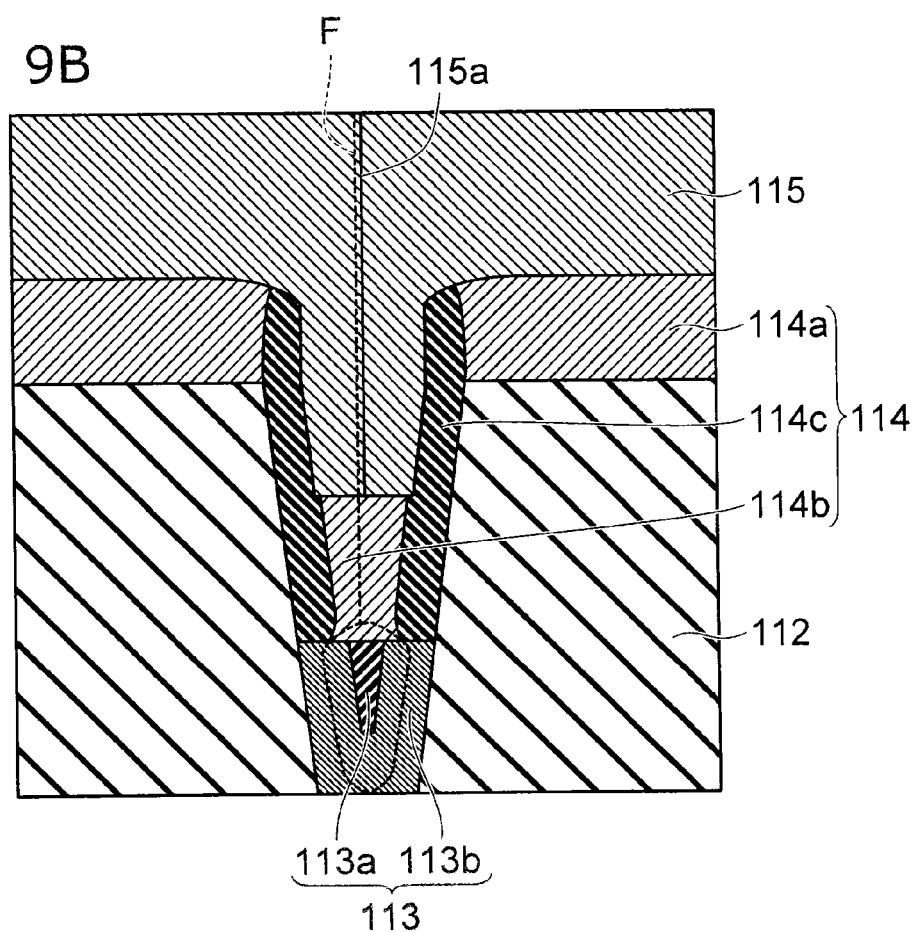
FIG. 9B is a schematic view showing how the current flows in portion A shown in FIG. 1.

FIG. 9A is an enlarged view of portion B shown in FIG. 5A of the memory device according to the embodiment; and FIG. 9B is a schematic view showing how the current flows in portion A shown in FIG. 1.

In the memory device 100 according to the embodiment as shown in FIG. 9A, the upper surface of the plug 113 is formed to be lower than the upper surface of the insulating film 112.

In this state, the variable resistance film 114 is formed on the plug 113 and the insulating film 112 by repeatedly stacking thin layers including germanium telluride (GeTe) and antimony telluride (SbTe) using sputtering. Thereby, the variable resistance film 114 that is on the flat surfaces, i.e., the variable resistance film 114 that is on the insulating film 112 and on the plug 113, is formed as the superlattice structure regions 114a and 114b. On the other hand, a difference in levels is formed between the upper surface of the plug 113 and the upper surface of the insulating film 112. At the side surface of the stepped portion and in the region directly above the side surface of the stepped portion, the orientation of the superlattice of the variable resistance film 114 degrades; and the variable resistance film 114 is formed as the amorphous structure region 114c including a polycrystal.

Generally, the variable resistance film 114 having the superlattice structure is not formed easily in a direction perpendicular to the film formation surface; and the orientation of the superlattice degrades as a result of defects that occur easily. Thereby, the superlattice structure region 114b is formed at the central portion of the upper surface of the plug 113; and the amorphous structure region 114c that includes the polycrystal is formed at the outer circumferential portion of the plug 113. The current that flows in the plug 113 flows to pierce the superlattice structure region 114b on the plug 113. On the other hand, the current does not flow easily in the amorphous structure region 114c because the resistance is high. Thereby, the drive current value of the memory device can be reduced by the variable resistance film of the memory device including the superlattice structure in which the resistance change ability arises due to a small amount of electrical power. Also, because the region where the current flows can be confined, the fluctuation of the drive current value between the elements can be suppressed; and the operations become stable.

Although the configuration of the plug 113 is shown as a circular-conic trapezoid configuration in the embodiment, the configuration of a rectangular parallelepiped, etc., may be used. Also, although sputtering is described as an example, CVD (vapor deposition), molecular beam epitaxy, vapor deposition, etc., may be used.

A modification of the first embodiment will now be described.

In the memory device according to the modification as shown in FIG. 9B, a boundary which is a discontinuity of the crystal structure is formed in the conductive member 115.

In the case where the recess on the variable resistance film 114 is deep to a certain level, a boundary 115a is formed in the conductive member 115 in the region directly above the superlattice structure region 114b when depositing the conductive member 115 by the upper surfaces of the deposited layers grown on the inner surface of the recess contacting each other.

Other than the boundary 115a formed in the conductive member 115 and the height of the protrusion, the configuration of the memory device according to the modification is similar to that of the memory device according to the first embodiment.

Effects of the modification will now be described.

In the memory device according to the modification, the crystal structure of the conductive member 115 is discontinuous at the boundary 115a formed in the conductive member 115. When an electric field concentrates in the boundary 115a, electrons selectively flow into the portion where the boundary 115a is formed; and therefore, the current flows in a path such as the broken line F shown in FIG. 9B. Thereby, the current path is confined; and the memory device can be driven efficiently and stably.

Thereby, because the region where the current flows can be confined further, the fluctuation of the drive current value between the elements can be suppressed further; and the operations become stable.

Second Embodiment

A memory device according to a second embodiment will now be described.

Other than the plug 113 and the variable resistance film 114, the configuration of the memory device according to the embodiment is the same as that of the memory device 100 according to the first embodiment.

Figure 10:
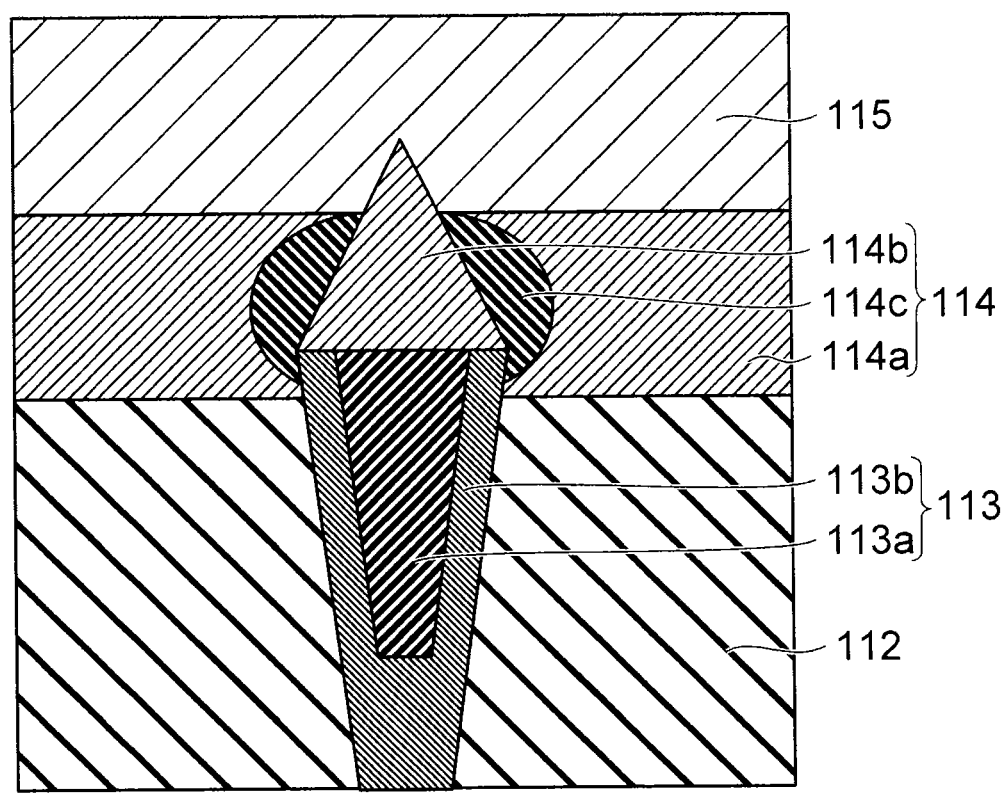
FIG. 10 is an enlarged cross-sectional view corresponding to portion A shown in FIG. 1 of a memory device according to a second embodiment.

FIG. 10 is an enlarged cross-sectional view corresponding to portion A shown in FIG. 1 of the memory device according to the embodiment.

Figure 11:
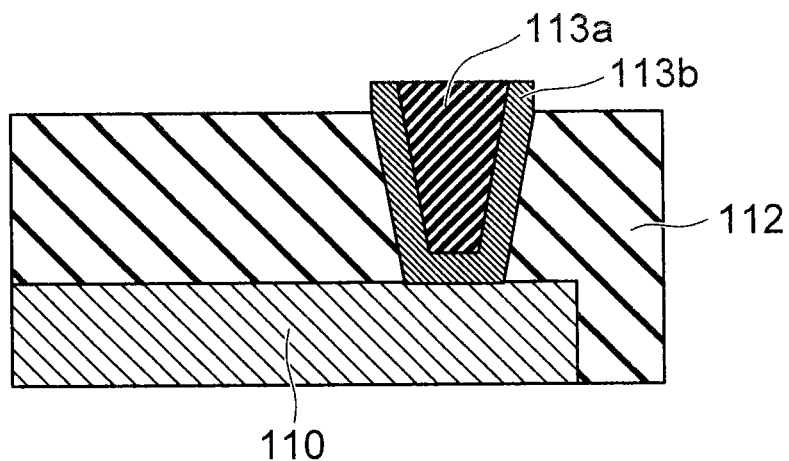
FIG. 11 is an enlarged cross-sectional view showing wet etching of the insulating film of portion D shown in FIG. 4A.

FIG. 11 is an enlarged cross-sectional view showing wet etching of the insulating film of portion D shown in FIG. 4A.

In the memory device according to the embodiment as shown in FIG. 10, the upper surface of the plug 113 protrudes with respect to the upper surface of the insulating film 112. The variable resistance film 114 is provided on the insulating film 112 and on the plug 113. The variable resistance film 114 forms the superlattice structure region 114a on the insulating film 112. Also, the superlattice structure region 114b is formed on the plug 113. On the other hand, the variable resistance film 114 forms the amorphous structure region 114c at the stepped portion between the insulating film 112 and the plug 113. The superlattice structure region 114a and the superlattice structure region 114b are separated by the amorphous structure region 114c.

A method for manufacturing the memory device according to the embodiment will now be described.

First, the processes shown in FIG. 3A to FIG. 4B are implemented similarly to the first embodiment.

Then, as shown in FIG. 11, the insulating film 112 is caused to recede by wet etching using a solution of hydrofluoric acid, etc. By the wet etching, the insulating film 112 upper surface is patterned to be lower than the upper surface of the plug 113. It is desirable for the receded amount of the insulating film 112 to be such that the upper surface of the insulating film 112 is 5 nm or more from the upper surface of the plug 113.

The subsequent processes are similar to those of the first embodiment; and the processes of and after FIG. 5A are implemented.

Thus, the memory device according to the embodiment is formed.

Effects of the embodiment will now be described.

In the memory device according to the embodiment as shown in FIG. 10, a difference in levels is formed between the insulating film 112 upper surface and the plug 113 upper surface. The superlattice structure region 114a formed on the insulating film 112 is separated from the superlattice structure region 114b having the circular conic configuration formed on the plug 113 by the amorphous structure region 114c including the polycrystal formed at the stepped portion periphery.

In the manufacturing processes, when forming the variable resistance film 114 on the insulating film 112 and on the plug 113 using sputtering, the orientation of the superlattice structure degrades at the stepped portion. Accordingly, the amorphous structure region 114c that includes the polycrystal is formed at the periphery of the side portion of the plug 113 and above the periphery of the side portion. On the other hand, the superlattice structure region 111b is formed on the insulating film 112 upper surface and on the upper surface of the plug 113 because the orientation of the superlattice structure is aligned. At this time, for the variable resistance film 114 on the upper surface of the plug 113, the orientation of the side surface of the superlattice structure region 113b degrades as stacking progresses due to the effect of the stepped portion. Thereby, the superlattice structure region 114b is formed in a circular conic configuration having its bottom surface contacting the plug 113. Also, the superlattice structure region 114a is formed at the upper surface of the insulating film 112.

When a voltage is applied to the variable resistance film 114, a current flows in the superlattice structure region 114b on the plug 113. On the other hand, the current does not flow easily in the amorphous structure region 114c because the resistance is high.

Thereby, even in the case where the plug 113 is not patterned into a recessed shape, the current path can be confined to only the superlattice structure region 114b formed on the plug 113. Accordingly, the drive current value of the memory device is reduced; and the fluctuation of the drive current value between the elements can be suppressed.

Third Embodiment

A third embodiment will now be described.

Other than the plug 113 and the variable resistance film 114, the configuration of the memory device according to the embodiment is the same as that of the memory device according to the first embodiment.

Figure 12:
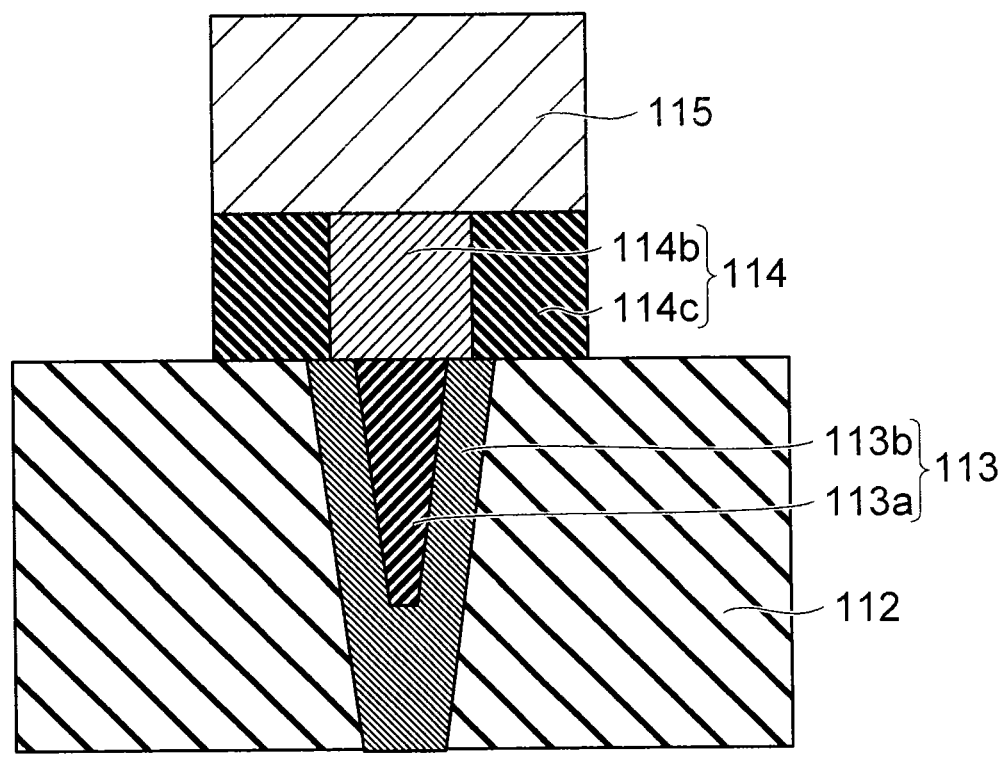
FIG. 12 is an enlarged view corresponding to portion A shown in FIG. 1 of a memory device according to a third embodiment.

FIG. 12 is an enlarged view corresponding to portion A shown in FIG. 1.

In the embodiment as shown in FIG. 12, a difference in levels is not formed in the surface of the insulating film 112; and the surface is flat. The variable resistance film 114 is formed in a region on the insulating film 112 including the region directly above the plug 113. For the variable resistance film 114 in the region directly above the plug 113, the superlattice structure region 114b is formed; and the amorphous structure region 114c is provided around the side surface of the superlattice structure region 114b. The conductive member 115 is formed on the variable resistance film 114.

A method for manufacturing the memory device according to the embodiment will be described.

First, the processes shown in FIG. 3A to FIG. 4B are implemented similarly to the first embodiment.

Then, the variable resistance film 133 is formed on the upper surface of the insulating film 112 and on the upper surface of the plug 113. The variable resistance film 133 is formed by repeatedly stacking thin layers including germanium telluride (GeTe) and antimony telluride (SbTe) using sputtering. Although sputtering is described as an example, CVD (vapor deposition), molecular beam epitaxy, vapor deposition, etc., may be used.

Then, the conductive film 134 is formed on the variable resistance film 133. The conductive film 134 is formed using, for example, a metal material such as tungsten, titanium, tantalum, a nitride of these elements, etc.

Then, the variable resistance film 133 and the conductive film 134 are removed by anisotropic etching such as RIE, etc., so that the variable resistance film 133 and the conductive film 134 remain only on the insulating film 112 in a region including the region directly above the plug 113. Thereby, the variable resistance film 133 is patterned into the variable resistance film 114; and the conductive film 131 is patterned into the conductive member 115.

Then, the end portion of the element is oxidized by oxygen plasma. At this time, the oxidization by the plasma is adjusted so that the central portion of the variable resistance film 114 is not oxidized. Thereby, the central portion of the variable resistance film 114 becomes the superlattice structure region 114b; and the side wall portion of the variable resistance film 114 becomes the amorphous structure region 114c. At this time, the oxygen concentration of the amorphous structure region 114c is higher than the oxygen concentration of the superlattice structure region 114b. Also, the amorphous structure may be formed at the side wall portion of the variable resistance film 114 by, for example, nitriding by nitrogen plasma or sputtering using argon. Thereby, the superlattice structure is formed only on the plug 113.

For the subsequent processes, the processes of and after FIG. 6A are implemented similarly to the first embodiment.

Thus, the memory device according to the embodiment is formed.

Effects of the memory device according to the embodiment will now be described.

In the memory device according to the embodiment, the superlattice structure region 114b is formed in only the variable resistance film 114 on the plug; and for the variable resistance film 114 around the superlattice structure, the amorphous structure region 114c is formed. Thereby, even in the case where a difference in levels is not formed between the plug 113 upper surface and the insulating film 112 upper surface, it is possible to confine the region where the current flows. Thereby, the drive current value is reduced; and the fluctuation of the drive current value between the elements can be suppressed.

Fourth Embodiment

A fourth embodiment will now be described.

Figure 13:
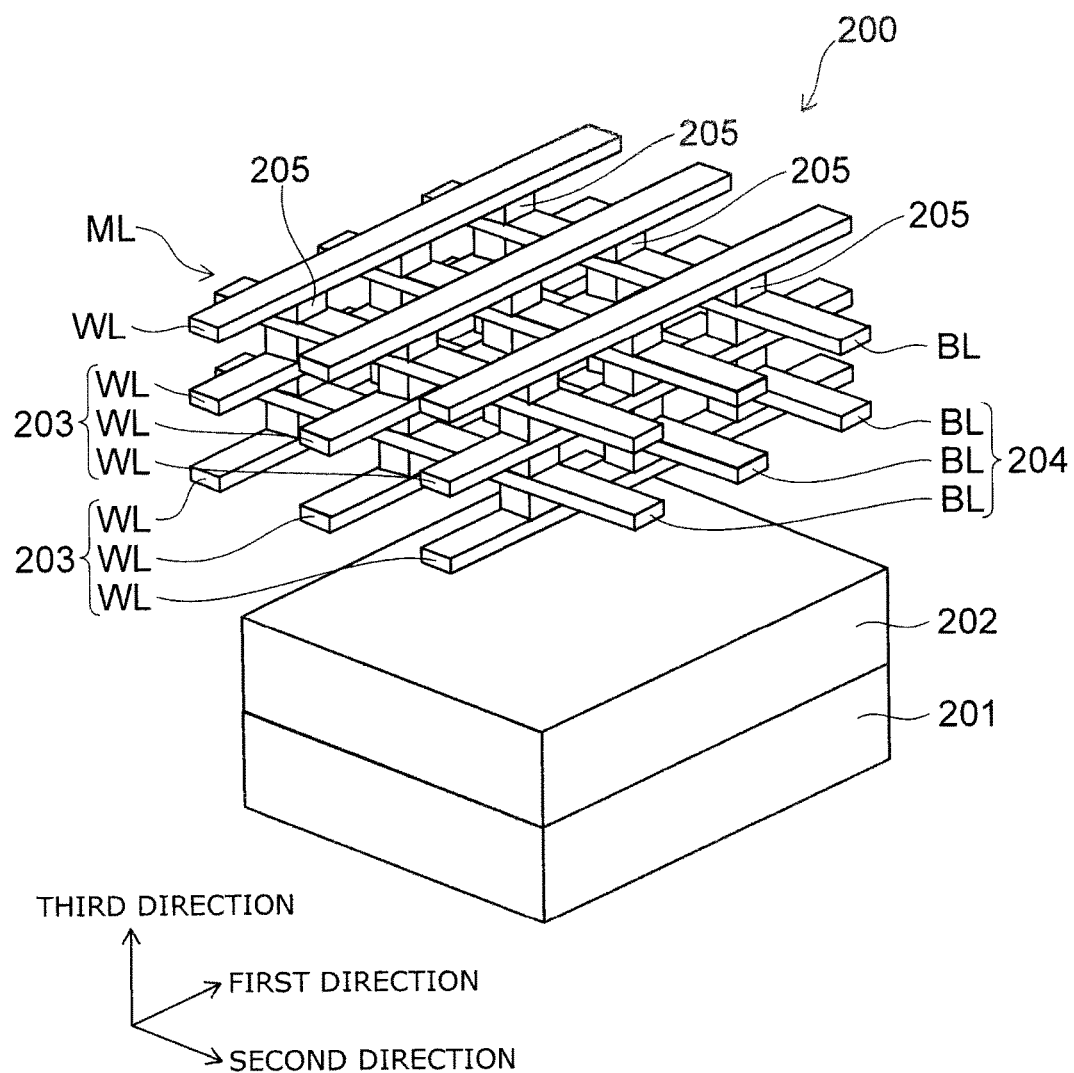
FIG. 13 is a perspective view showing a memory device according to a fourth embodiment.

FIG. 13 is a perspective view showing a memory device according to the embodiment.

As shown in FIG. 13, a semiconductor substrate 201 is provided in the memory device 200.

For convenience of description hereinbelow, mutually-orthogonal directions parallel to the upper surface of the semiconductor substrate 201 are taken as a "first direction" and a "second direction"; and a direction perpendicular to the upper surface of the semiconductor substrate 201 is taken as a "third direction".

An inter-layer insulating film 202 is provided on the semiconductor substrate 201.

A stacked body ML in which a word line interconnect layer 203 and a bit line layer 204 are stacked alternately in the third direction is provided on the inter-layer insulating film 202, where the word line interconnect layer 203 includes multiple word lines WL extending in the first direction, and the bit line layer 204 includes multiple bit lines BL extending in the second direction. The word lines WL do not contact each other; the bit lines BL do not contact each other; and the word lines WL do not contact the bit lines BL.

Also, a pillar 205 is provided at the most proximal point between each of the word lines WL and each of the bit lines BL. Thus, the memory device 200 is a three-dimensional cross-point memory device in which memory cells are disposed at each of the most proximal points between the word lines WL and the bit lines BL. The space between the word lines WL, the bit lines BL, and the pillars 205 is filled with an inter-layer insulating film (not shown).

The pillar 205 will now be described.

Figure 14:
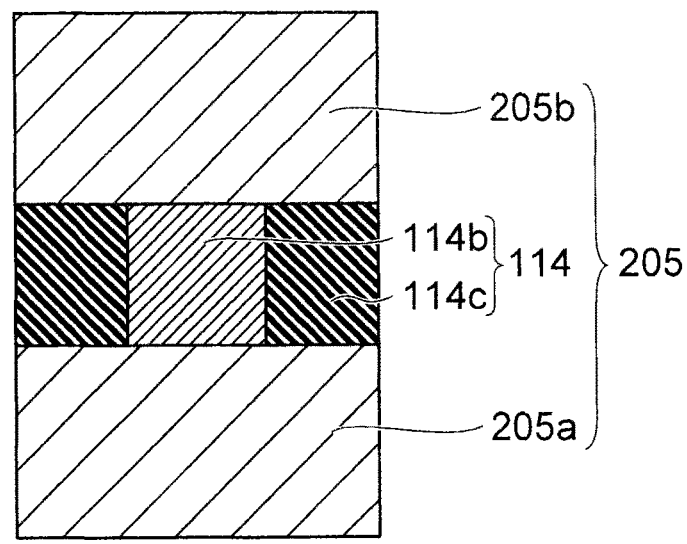
FIG. 14 is an enlarged cross-sectional view of the pillar shown in FIG. 13.

FIG. 14 is an enlarged cross-sectional view of the pillar shown in FIG. 13.

As shown in FIG. 14, the pillar 205 is formed of an electrode film 205a, the variable resistance film 114 on the electrode film 205a, and an electrode film 205b on the variable resistance film 114.

The central portion of the variable resistance film 114 becomes the superlattice structure region 114b; and the side portion becomes the amorphous structure region 114c. Thereby, the pillar 205 becomes a memory member and functions as a resistance change memory element. One memory cell includes one pillar 205.

Effects of the embodiment will now be described.

In the embodiment, in the stacked memory device 200 such as that shown in FIG. 14, the current path can be confined by forming the local superlattice structure region 114b in the variable resistance film 114. Thereby, in a stacked resistance change memory device as well, the drive current value is reduced; and the fluctuation of the drive current value between the elements can be suppressed.

Fifth Embodiment

A fifth embodiment will now be described.

Figure 15:
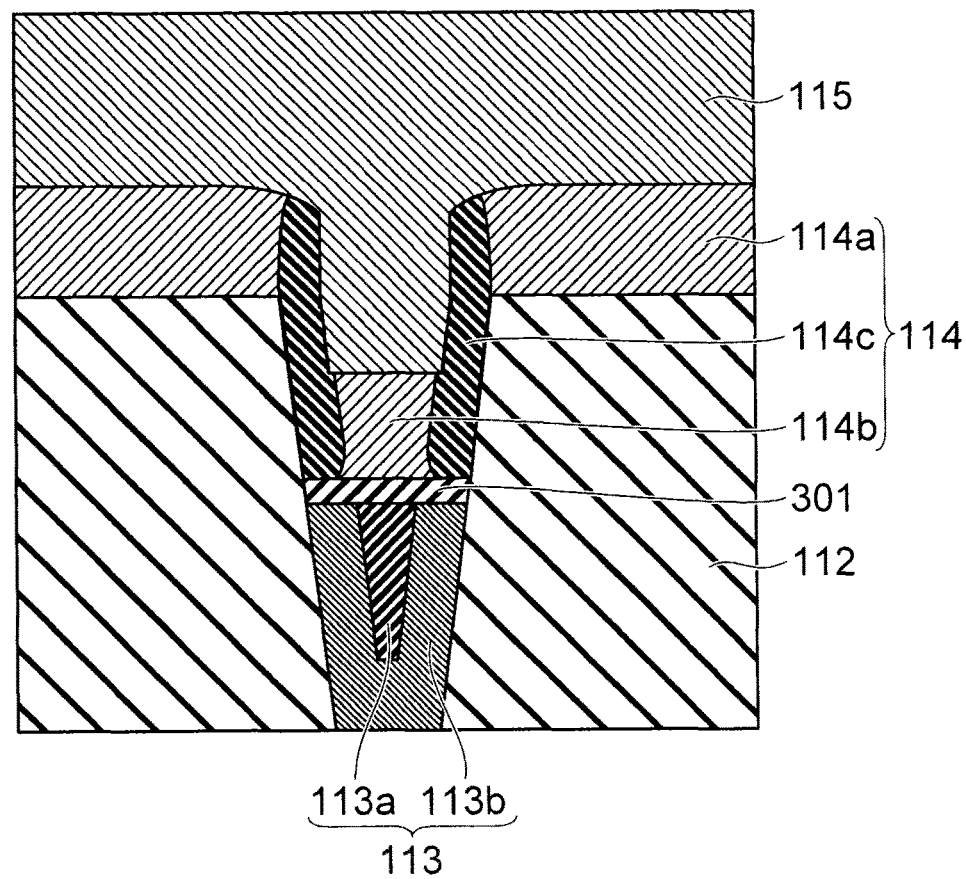
FIG. 15 is an enlarged cross-sectional view corresponding to portion A of FIG. 1 of a memory device according to a fifth embodiment.

FIG. 15 is an enlarged cross-sectional view corresponding to portion A of FIG. 1 of the memory device according to the embodiment.

As shown in FIG. 15, a metal oxide film is 301 provided between the plug 113 and the variable resistance film 114.

Other than the metal oxide film being 301 provided between the plug 113 and the variable resistance film 114, the configuration of the memory device according to the embodiment is similar to that of the memory device according to the first embodiment.

Effects of the embodiment will now be described.

In the memory device according to the embodiment, dielectric breakdown occurs in the metal oxide film 301 by the electric field applied to the metal oxide film 301. Due to the dielectric breakdown, a confined current path is formed in the metal oxide film 301. Thereby, the effective surface area that affects the electrical characteristics of the element can be reduced.

A first modification of the fifth embodiment will now be described.

Figure 16:
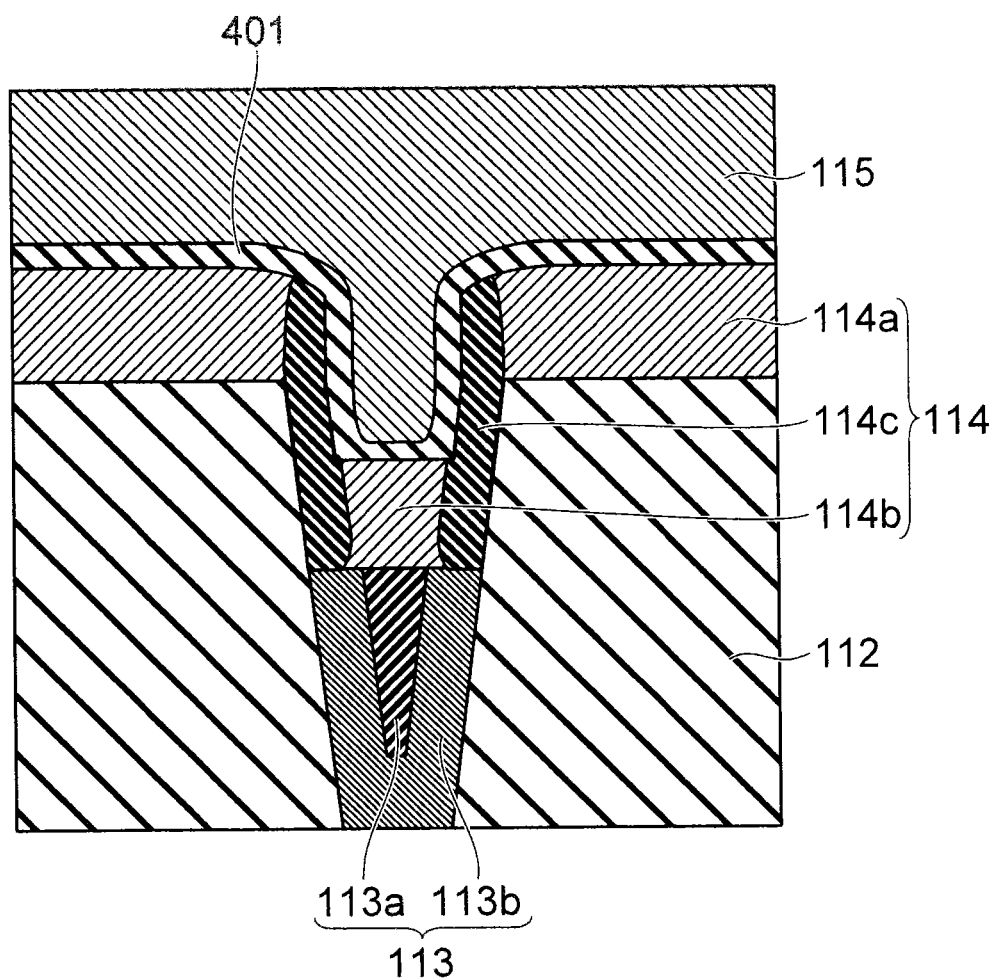
FIG. 16 is an enlarged cross-sectional view corresponding to portion A of FIG. 1 of a memory device according to a first modification of the fifth embodiment.

FIG. 16 is an enlarged cross-sectional view corresponding to portion A of FIG. 1 of the memory device according to the modification.

As shown in FIG. 16, a metal oxide film 401 is provided between the variable resistance film 114 and the conductive member 115.

Other than the metal oxide film being 401 provided between the variable resistance film 114 and the conductive member 115, the configuration of the memory device according to the modification is similar to that of the memory device according to the first embodiment.

Effects of the modification will now be described.

In the memory device according to the modification, dielectric breakdown occurs in the metal oxide film 401 due to the electric field applied to the metal oxide film 401. Due to the dielectric breakdown, a confined current path is formed in the metal oxide film 401. Thereby, the effective surface area that affects the electrical characteristics of the element can be reduced.

A second modification of the fifth embodiment will now be described.

Figure 17:
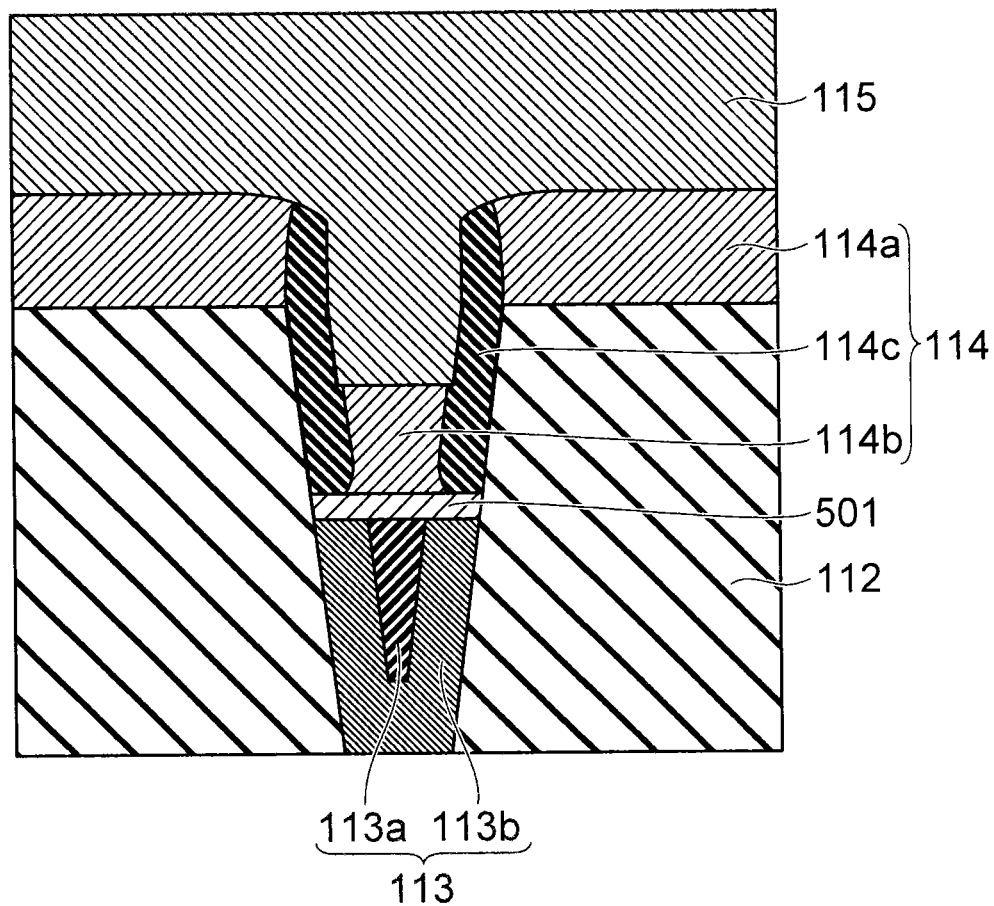
FIG. 17 is an enlarged cross-sectional view corresponding to portion A of FIG. 1 of a memory device according to a second modification of the fifth embodiment.

FIG. 17 is an enlarged cross-sectional view corresponding to portion A of FIG. 1 of the memory device according to the modification.

As shown in FIG. 17, an electrical conduction film 501 that uses carbon nanotubes is provided between the plug 113 and the variable resistance film 114.

Other than the electrical conduction film 501 being provided between the plug 113 and the variable resistance film 114, the configuration of the memory device according to the modification is similar to that of the memory device according to the first embodiment.

The electrical conduction film 501 is formed by coating a dispersion solution including carbon nanotubes onto the upper surface of the plug 113 and drying.

Effects of the modification will now be described.

In the memory device according to the modification, a confined current path is formed between the plug 113 and the variable resistance film 114 due to the carbon nanotubes included in the electrical conduction film 501. Thereby, the effective surface area that affects the electrical characteristics of the element can be reduced.

A third modification of the fifth embodiment will now be described.

Figure 18:
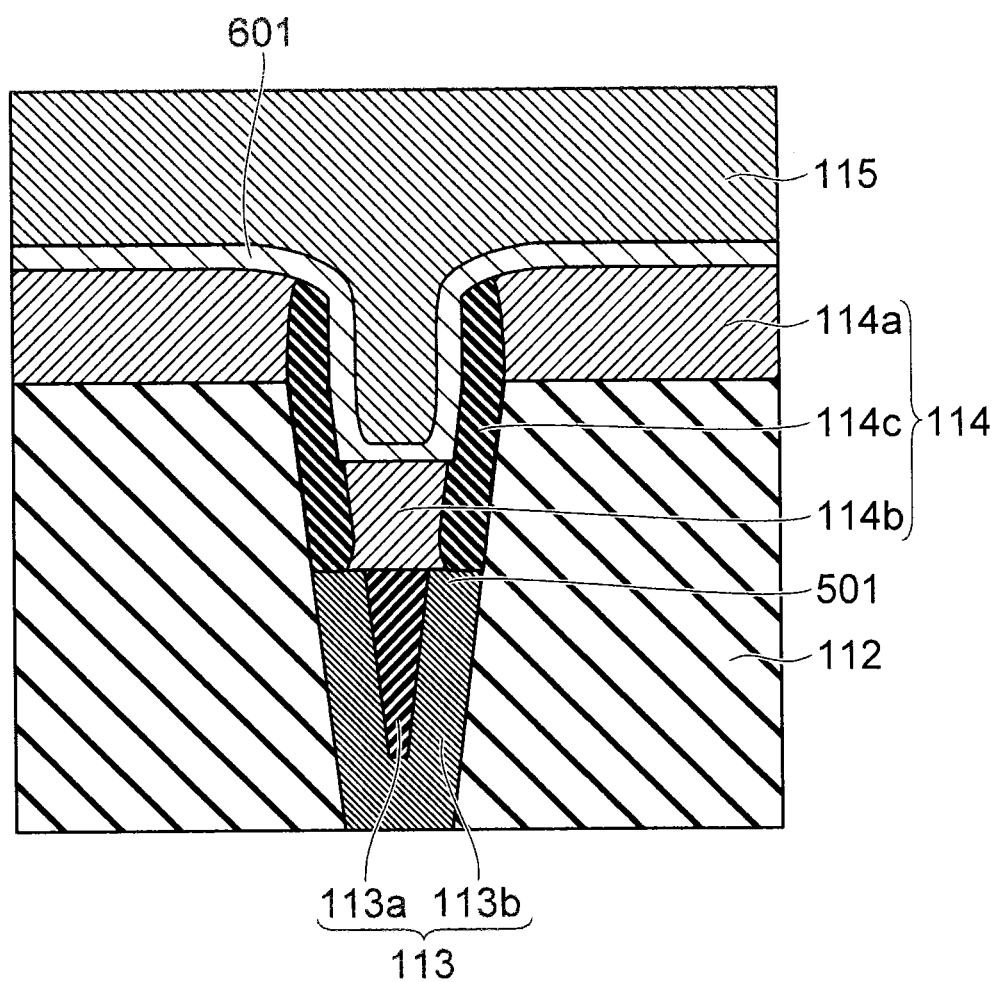
FIG. 18 is an enlarged cross-sectional view corresponding to portion A of FIG. 1 of a memory device according to a third modification of the fifth embodiment.

FIG. 18 is an enlarged cross-sectional view corresponding to portion A of FIG. 1 of the memory device according to the modification.

As shown in FIG. 18, an electrical conduction film 601 that uses carbon nanotubes is provided between the variable resistance film 114 and the conductive member 115.

Other than the electrical conduction film 601 being provided between the variable resistance film 114 and the conductive member 115, the configuration of the memory device according to the modification is similar to that of the memory device according to the first embodiment.

The electrical conduction film 601 is formed by coating a dispersion solution including carbon nanotubes onto the upper surface of the variable resistance film 114 and drying.

Effects of the modification will now be described.

In the memory device according to the modification, a confined current path is formed between the variable resistance film 114 and the conductive member 115 due to the carbon nanotubes included in the electrical conduction film 601. Thereby, the effective surface area that affects the electrical characteristics of the element can be reduced.

Although examples are illustrated in the fifth embodiment and the modifications of the fifth embodiment in which the plug 113 has a structure in which a difference in levels having a recessed shape is formed with the upper surface of the insulating film 112 as in the memory device 100 according to the first embodiment, these are not limited thereto. For example, the examples may be used also in the memory devices according to the second to fourth embodiments.

According to the embodiments described above, a memory device having a low drive current value and small fluctuation of the drive current value between the memory cells can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device, comprising:
a plug;
a variable resistance film provided on the plug; and
an electrode provided on the variable resistance film,
the variable resistance film including:
a first portion having a superlattice structure; and
a second portion having an amorphous structure,
the plug includes:
an insulating member; and
a conductive member provided on a bottom surface of the insulating member and on a side surface of the insulating member,
the first portion contacts with at least a part of the conductive member.

2. The memory device according to claim 1, wherein the first portion includes:
first layers containing germanium and tellurium; and
second layers containing antimony and tellurium,
each of the first layers and each of the second layers are stacked alternately.

3. The memory device according to claim 1, wherein a discontinuity of a crystal structure is formed in a region of the electrode directly above the first portion.

4. The memory device according to claim 1, further comprising an insulating film covering a side surface of the plug.

5. The memory device according to claim 4, wherein
an upper surface of the plug protrudes with respect to an upper surface of the insulating film,
the first portion is separated from a side surface of the protruding portion of the plug, and
the second portion contacts the side surface of the protruding portion.

6. The memory device according to claim 1, wherein an oxygen concentration of the second portion is higher than an oxygen concentration of the first portion.

7. The memory device according to claim 1, further comprising a metal oxide film provided between the plug and the variable resistance film, the metal oxide film being capable of conducting in a film thickness direction.

8. The memory device according to claim 1, further comprising a metal oxide film provided between the variable resistance film and the electrode, the metal oxide film being capable of conducting in a film thickness direction.

9. The memory device according to claim 1, further comprising an electrical conduction film including carbon nanotubes provided between the plug and the variable resistance film.

10. A memory device, comprising:
a semiconductor substrate;
a plurality of first interconnects provided on the semiconductor substrate to extend in a first direction;
a plurality of second interconnects provided on a first interconnect layer to extend in a second direction crossing the first direction; and
a plurality of variable resistance films connected between each of the first interconnects and each of the second interconnects,
each of the variable resistance films including:
a first portion having a superlattice structure; and
a second portion having an amorphous structure,
an oxygen concentration of the second portion being higher than an oxygen concentration of the first portion.

11. A memory device, comprising:
a plug;
a variable resistance film provided on the plug; and
an electrode provided on the variable resistance film,
the variable resistance film including:
a first portion having a superlattice structure; and
a second portion having an amorphous structure,
an upper surface of the second portion is positioned higher than an upper surface of the first portion.

12. The memory device according to claim 11, wherein the first portion includes:
first layers containing germanium and tellurium; and
second layers containing antimony and tellurium,
each of the first layers and each of the second layers are stacked alternately.

13. The memory device according to claim 11, wherein a discontinuity of a crystal structure is formed in a region of the electrode directly above the first portion.

14. The memory device according to claim 11, further comprising an insulating film covering a side surface of the plug.

15. The memory device according to claim 14, wherein
an upper surface of the plug protrudes with respect to an upper surface of the insulating film,
the first portion is separated from a side surface of the protruding portion of the plug, and
the second portion contacts the side surface of the protruding portion.

16. The memory device according to claim 11, wherein an oxygen concentration of the second portion is higher than an oxygen concentration of the first portion.

17. The memory device according to claim 11, further comprising a metal oxide film provided between the plug and the variable resistance film, the metal oxide film being capable of conducting in a film thickness direction.

18. The memory device according to claim 11, further comprising a metal oxide film provided between the variable resistance film and the electrode, the metal oxide film being capable of conducting in a film thickness direction.

19. The memory device according to claim 11, further comprising an electrical conduction film including carbon nanotubes provided between the plug and the variable resistance film.

20. The memory device according to claim 11, further comprising an electrical conduction film including carbon nanotubes provided between the variable resistance film and the electrode.

* * * * *